United States Patent [19]

Polata

[11] 3,940,783
[45] Feb. 24, 1976

[54] MAJORITY CARRIERS-VARIABLE THRESHOLD RECTIFIER AND/OR VOLTAGE REFERENCE SEMICONDUCTOR STRUCTURE

[75] Inventor: Bohumil Polata, Los Altos, Calif.
[73] Assignee: Signetics Corporation, Sunnyvale, Calif.
[22] Filed: Feb. 11, 1974
[21] Appl. No.: 441,675

[52] U.S. Cl. .................. 357/13; 357/33; 357/48; 357/58; 357/90; 148/175
[51] Int. Cl.² .......................................... H01L 29/90
[58] Field of Search ........... 357/13, 33, 48, 58, 88, 357/90

[56] References Cited
UNITED STATES PATENTS

| | | | |
|---|---|---|---|
| 3,383,571 | 5/1968 | Turner et al. | 357/13 |
| 3,427,515 | 2/1969 | Blicher et al. | 357/13 |
| 3,469,117 | 9/1969 | Mizushima et al. | 357/13 |
| 3,544,855 | 12/1970 | Nannichi | 357/13 |
| 3,665,266 | 5/1972 | Drozdowicz et al. | 357/34 |
| 3,709,746 | 1/1973 | De Witt | 357/48 |
| 3,821,657 | 6/1974 | Yu et al. | 357/13 |
| 3,855,605 | 12/1974 | Kawamoto | 357/13 |
| 3,882,529 | 5/1975 | Warner | 357/13 |

OTHER PUBLICATIONS

R. Denning et al., "Epitaxial II–V, N–P–N High-Voltage Power Transistors," IEEE Trans. on Elec. Dev., Vol. Ed. 17, No. 9, Sept. 1970, pp. 711–716.
S. Liu et al., "Low Noise Punch-Through PN–V–P, P–N–P, and P–N–Metal Microwave Diodes," RCA Review, Vol. 32, Dec. 1971, pp. 636–644.

Primary Examiner—Andrew J. James
Assistant Examiner—Joseph E. Clawson, Jr.
Attorney, Agent, or Firm—Flehr, Hohbach, Test, Albritton & Herbert

[57] ABSTRACT

A majority charge carrier semiconductor structure including a relatively heavily doped n type support layer, a second n type layer formed on the support layer and having a relatively light doping, a p layer formed on the second n layer, and a third n type layer having a relatively heavy doping formed atop the p layer. When voltage means is applied between top and support layers principal current flow is by majority charge carriers in either direction determined by the polarity of a pre-determined voltage. Current flow occurs substantially below the critical electric field, and free of avalanche multiplication or tunneling. In alternate embodiments the doping impurity concentration may be varied to alternately provide a device wherein the magnitude of voltage reference which determines current flow in one direction or in the opposite direction may be symmetrical, asymmetrical or highly asymmetrical.

6 Claims, 36 Drawing Figures

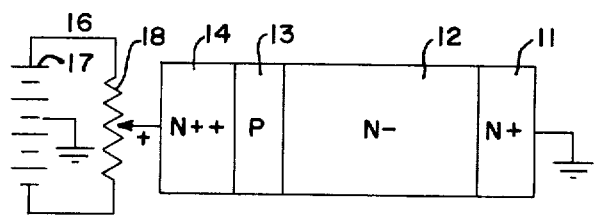
FIG.—1a
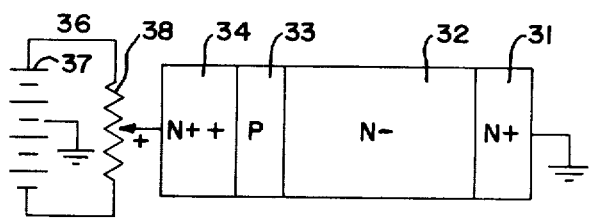
FIG.—2a
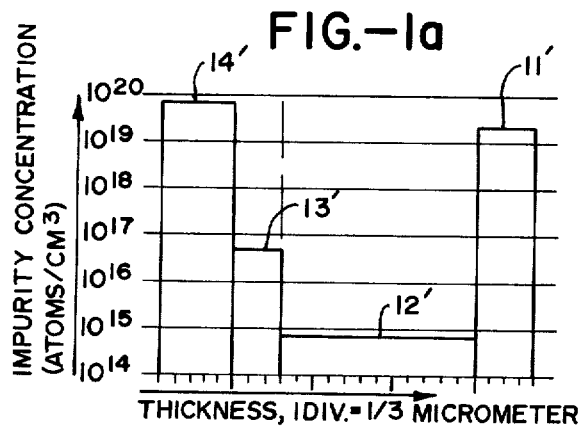
FIG.—1b
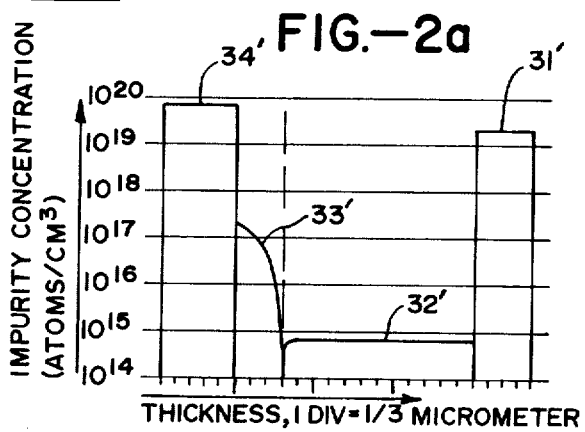
FIG.—2b
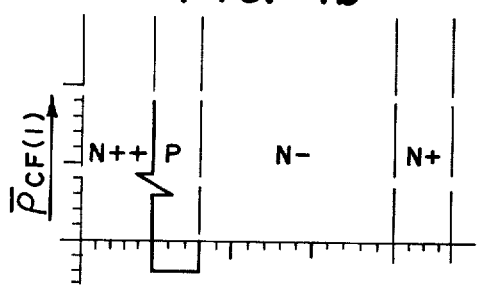
FIG.—1c
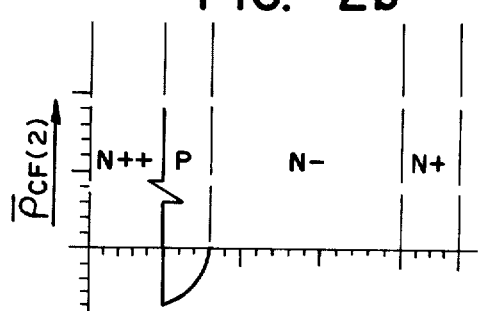
FIG.—2c
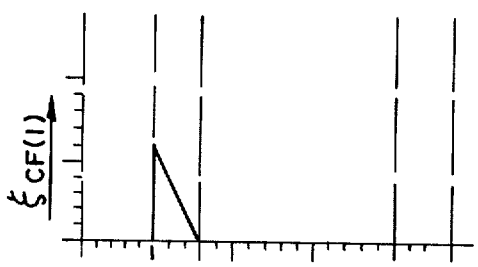
FIG.—1d
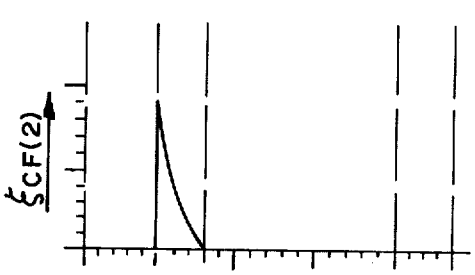
FIG.—2d
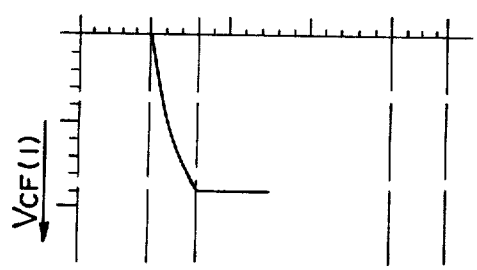
FIG.—1e
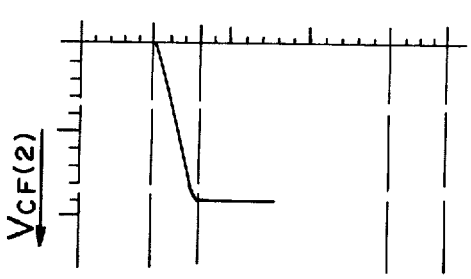
FIG.—2e

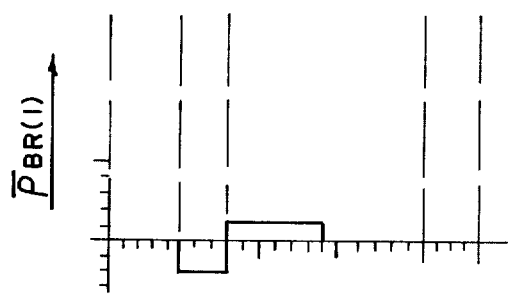
FIG.—1f
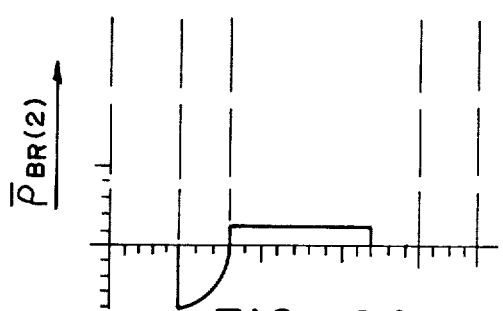
FIG.—2f
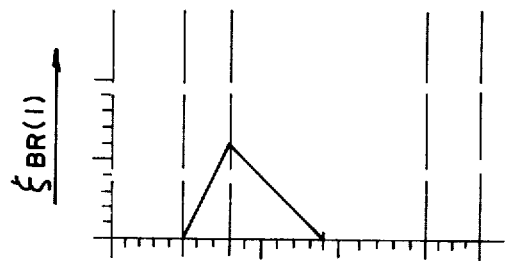
FIG.—1g
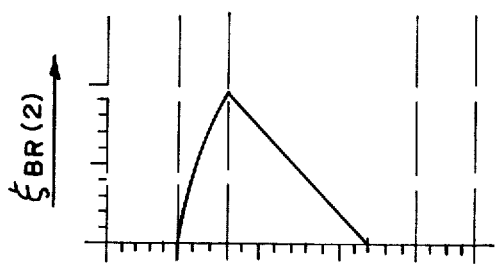
FIG.—2g
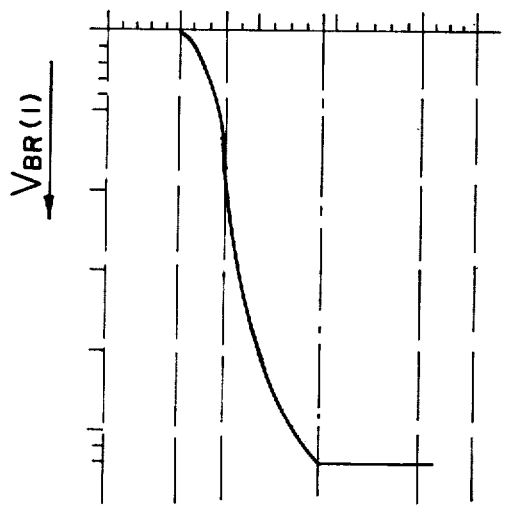
FIG.—1h
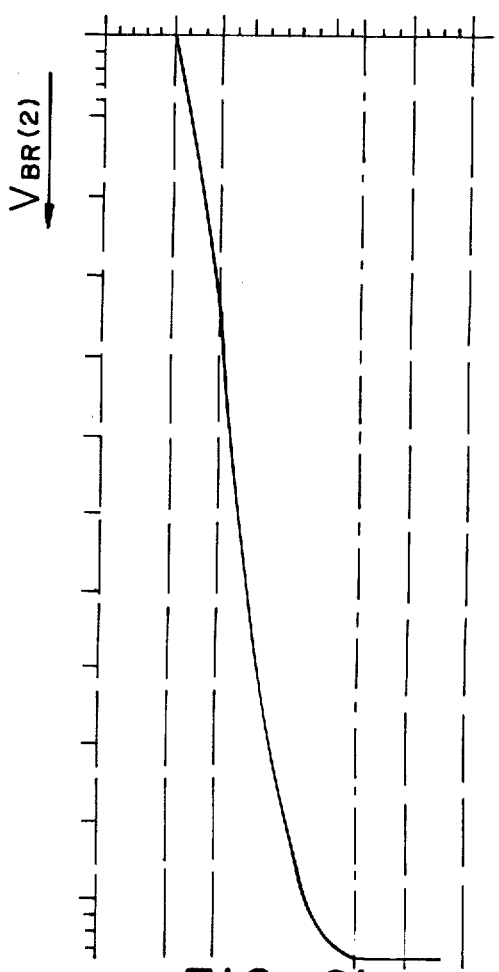
FIG.—2h

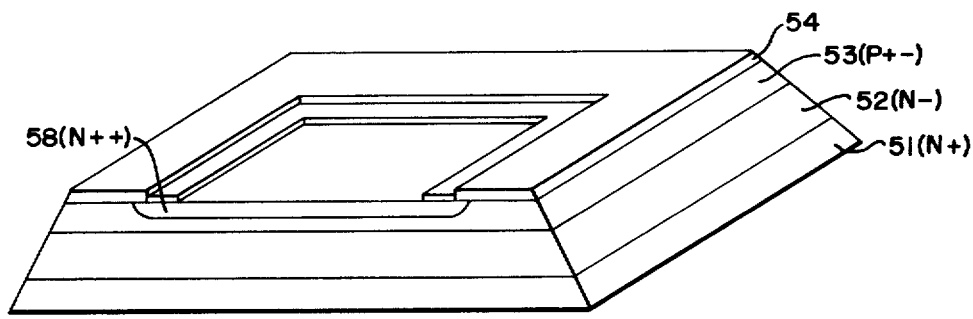
FIG.—3a
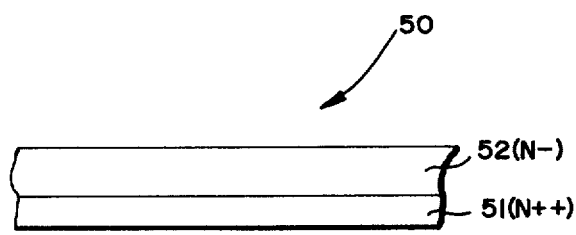
FIG.—3b
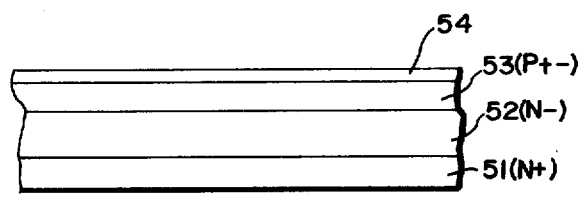
FIG.—3c
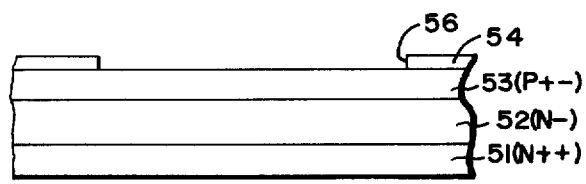
FIG.—3d
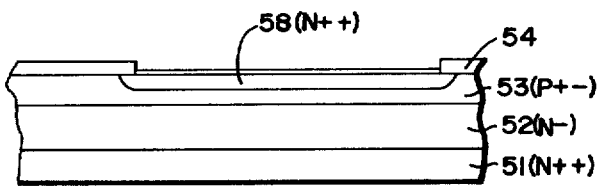
FIG.—3e
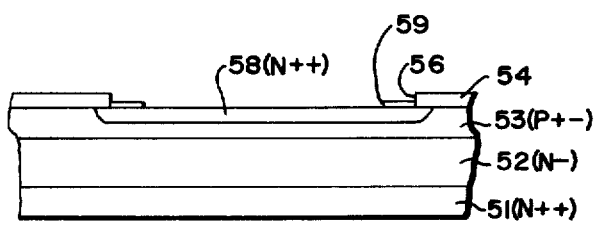
FIG.—3f
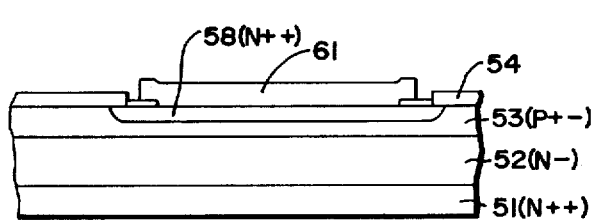
FIG.—3g

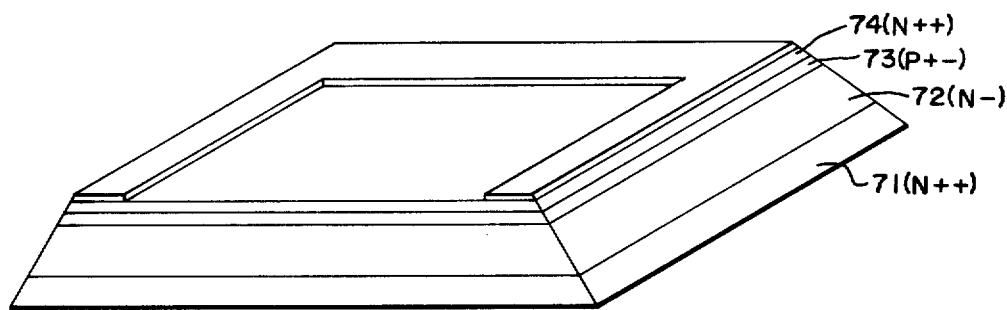
FIG.-4a
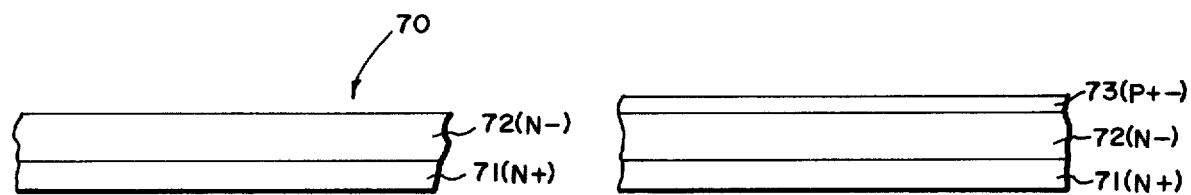
FIG.-4b  FIG.-4c
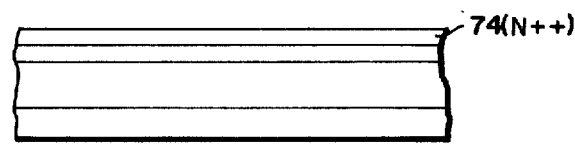 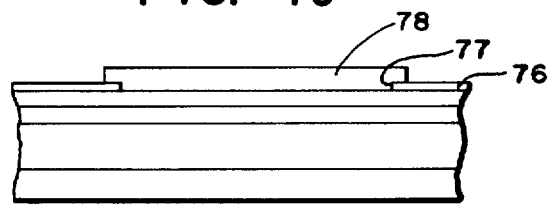
FIG.-4d  FIG.-4e
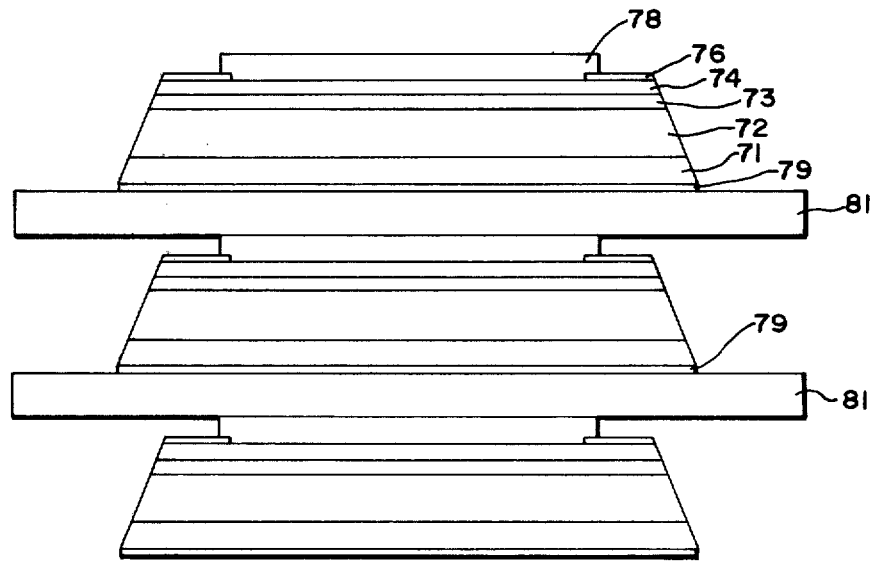
FIG.-4f 3,940,783

MAJORITY CARRIERS-VARIABLE THRESHOLD RECTIFIER AND/OR VOLTAGE REFERENCE SEMICONDUCTOR STRUCTURE

BACKGROUND OF THE INVENTION

Although rectifiers and voltage reference semiconductor structures heretofore have been provided, operation has been via minority charge carriers having prolonged carrier life time and high junction capacitance. There is a need for rectifier and voltage reference semiconductor devices which function principally via majority carriers, and further a need for such devices which can be integrated with other integrated circuit technology.

SUMMARY OF THE INVENTION AND OBJECTS

The majority carrier semiconductor structure comprises a relatively heavily doped n type support layer, a second n layer having a relatively light doping formed on the support layer, a p layer formed on the second n layer, and a third n type layer having a relatively heavy doping formed atop the p layer. Voltage means applied to the structure produces, in a first embodiment, an asymmetrical voltage-current relationship for current flow in one direction as compared to the voltage-current relationship for current flow in the opposite direction. Alternate embodiments may provide symmetrical voltage-current relationships and compatibility of the structure with integrated circuit technology.

In general, it is an object of the present invention to provide a majority carrier semiconductor structure.

Another object of the invention is to provide a semiconductor structure which can be utilized for performing functions previously performed by rectifier and voltage reference diodes.

Another object of the invention is to provide a semiconductor structure which realizes principal current flow via majority charge carriers.

Another object of the invention is to provide a new semiconductor device useful as a discrete component and alternatively as an integral portion of an integrated circuit.

Additional objects and features of the invention will appear from the following description of the preferred embodiments, as hereinafter set forth.

BRIEF DESCRIPTION OF THE DRAWING

FIGS. 1a–h shows an idealized model of the invention including operational characteristics of the device.

FIGS. 2a–h is an idealized model of the present invention having a p layer impurity concentration suitably graded and operational characteristics for the device.

FIGS. 3a–g shows an isometric view of the structure and cross sectional views of the processing steps for a first embodiment of the invention.

FIGS. 4a–f shows an isometric view of the structure and cross-sectional views of the processing steps for a second embodiment of the invention.

DESCRIPTION OF THE PREFERRED EMBODIMENTS

Figure 5A:
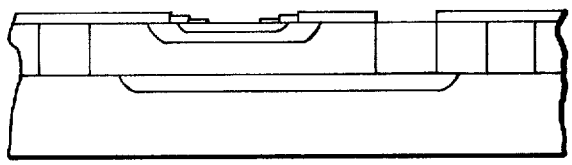
FIGS. 5a–h shows cross-sectional views of the structure and the processing steps for an embodiment of the invention compatible with conventional integrated circuit processing.

Referring to FIG. 1a, an idealized model of the invention is shown including an n+ layer 11 having a corresponding impurity concentration 11' as shown in FIG. 1b. An n− layer 12 has a corresponding impurity concentration 12', a p layer 13 has a corresponding impurity concentration 13'. A n++ layer 14 has a corresponding impurity concentration 14'. Layer 11 may be 1⅓ microns in thickness, layer 12 4 microns, layer 13 1 micron and layer 14 1⅔ microns. Voltage means 16 includes a center tapped voltage source 17 and output control 18. A first output terminal of voltage means 16 is connected to the ground and is also connected to the n+ layer 11. A second output terminal of voltage means 16 is connected to n++ layer 14.

When the voltage means 16 is adjusted to provide a positive voltage to layer 14 and with respect to ground the resulting current flow produces the following operation. The depletion layer at the layer 14-layer 13 interface begins to form as the voltage is increased. As between the two layers 13 and 14, the n++ layer 14 has a relatively high doping concentration and thus the depletion layer spreads mainly into the p layer 13. As the voltage means 16 is further increased only negligible steady state current flow occurs until the p layer 13 is fully depleted.

As voltage means 16 is further increased a voltage level is reached wherein the p region 13 is fully depleted and significant current flow is about to occur. At this point the potential across the p type layer 13, the space-charge conducting region, is equal to and opposite the voltage means 16 output voltage. This voltage is shown as $V_{cfl}$ in FIG. 1e. Corresponding to this applied voltage, FIG. 1c shows the charge distribution $\rho_{cfl}$ and $\xi_{cfl}$ in FIG. 1d shows the corresponding electric field distribution. FIGS. 1c–e pictorially depict the classical Poisson's equation interrelationship of $\rho_{cfl}$, $\xi_{cfl}$ and $V_{cfl}$, that is, for a one dimensional situation:

$$\nabla^2 V = - \frac{\delta \xi}{\delta x} = - \frac{\rho(x)}{\epsilon \epsilon_o},$$

where $\epsilon$ is the relative permittivity and $\epsilon_o$ is the dielectric constant of free space. Integrating this expression the resulting $\xi$ field is obtained and has a peak value of:

$$\xi_{peak} = + \frac{qN a^x p}{\epsilon \epsilon_o}$$

The potential function $V(x)$ is equal to $-\int \xi(x)dx$. A further integration results in a parabolic potential function V having a maximum value of $$V_J = \frac{qN_a x_p^2}{2 \epsilon \epsilon_o},$$

where $V_J$ is the magnitude of the reverse voltage supported by the depletion layer and assuming that the ohmic drops in the bulk regions are negligible in comparison. Further the total width of a depletion layer extending into a p region at a P-N junction where the N region is infinitely highly doped with respect to the p region may be expressed as $$X_p = \frac{2\epsilon\epsilon_o V_j}{qN_a}^{(1/2)}$$

Where $X_o = X_p$ = width of the depletion layer, in centimeters, $V_j$ = voltage across the depletion layer, in volts, $N_a$ = acceptor concentration, in atoms per cubic centimeters, $\epsilon_o$ = dielectric constant of free space ($8.85 \times 10^{-14}$ farad/cm), $\epsilon$ = relative permittivity in silicon of 12, $q$ = electron charge ($1.6 \times 10^{-19}$ coulomb).

The maximum value of $V_{cf1}$ in FIG. 1e is shown by an amplitude of nine divisions which corresponds to the area under $\bar{\rho}_{cf1}$ equivalent to nine squares, and $\xi_{cf1}$ has a peak which is represented by six divisions which correspond to the area under $\bar{\rho}_{cf1}$ of six squares. The expressions as shown may be conventionally described as a definite integral relationship having appropriate boundary conditions and could be readily expressed mathematically. However the theory of operation of the device may be more readily understood by visual comparison and graphical analysis of the magnitudes.

A further increase in the voltage means 16 produces a current flow which cannot be further supported by the depletion region and consequently appears as an increase in the circuit loop current in a conventional Childs-law and Ohms-law relationships.

From the above it is clear that the principal current flow within the semiconductor structure is via majority charge carriers. Further it is clear that the current flow is not via minority charge carriers due to diffusion under the influence of the concentration gradient.

By way of further example, if layer 11 instead of being connected directly to ground was alternately connected via a capacitor to ground (not shown) then the theory of current flow becomes clear. The capacitor would charge to a voltage equal to the voltage means 16 applied to the circuit less the $V_{cf1}$ voltage appearing across the p layer. When voltage means 16 is adjusted current flow reestablishes the charge differential and then ceases when equilibrium is reached.

Still referring to FIG. 1a, when voltage means 16 is adjusted to provide a negative voltage at its output terminal, also connected to the n++ layer 14 and negative with respect to ground which is also connected to the n+ layer 11, then operation with current flow in the opposite direction is evident. As voltage means 16 is adjusted to become increasingly negative a depletion layer at the p layer 13, and n– layer 12 interface begins to form, FIG. 1f. Further, because of the relative doping between the p and n– regions the depletion layer extends within the n– region approximately twice as far as the corresponding layer extends within the p layer 13. Referring to FIG. 1f, a further increase in voltage means 16 continues to further deplete the p layer. At the point where the p layer is fully depleted, FIG. 1f shows the relative distribution between the p and n– layers. FIG. 1g shows the corresponding magnitude and distribution of the electric field, and FIG. 1h shows the applied potential across the p and n– layers, $V_{br1}$. This voltage $V_{br1}$ is equal to the area under the $\xi_{br1}$ distribution of FIG. 1g. Again FIGS. 1f–h pictorially depict the classical Poisson's equation interrelationship of $\bar{\rho}_{br1}$, $\xi_{br1}$ and $V_{br1}$ wherein the maximum value of $V_{br1}$ in FIG. 1h is shown having an amplitude of 27 divisions which corresponds to the area under $V_{br1}$ or 27 squares and $\xi_{br1}$ has a peak which is represented by six divisions which correspond to the area under $\bar{\rho}_{br1}$.

At this point the operation of the semiconductor structure is apparent. The total charge in the p layer 13 is equal for current flow in either direction as shown in FIGS. 1c and 1f, and the corresponding maximum value of the respective electric fields $\xi_{cf1}$ and $\xi_{br1}$ are also equal. However the blocking voltage $V_{br1}$ is three times as large as the respective voltage $V_{cf1}$. Thus it is readily apparent that the increase in $V_{br1}$ results from causing the depletion layer to form between the p layer 13 and the n– layer 12. In contrast, current flow in the opposite direction has produced, at the n++ layer 14 and p layer 13 interface, a depletion layer almost entirely within the p layer 13. Thus by causing the depletion layer to form at and within opposite interfacing layers in combination with the p layer 13, a two terminal device is shown having voltage-current transfer characteristics depending on the direction of current flow through the device.

Further, it is also apparent that a new and unique device provides rectification with operation via majority charge carriers within a semiconductor structure having asymmetrical layers of one conductivity type and a fully depleted layer of opposite conductivity type disposed therebetween.

Referring to FIGS. 2a–h, a semiconductor structure is shown in accord with the present invention wherein asymmetry has been further enhanced, by a factor of more than 6, by use of a suitably shaped doping profile. Referring to FIG. 2a, an idealized model of the invention having enhanced asymmetry is shown including an n+ layer 31 having a corresponding impurity concentration 31' as shown in FIG. 2b. An n– layer 32 has a corresponding impurity concentration 32', a p+–layer 33 has a corresponding impurity concentration 33'. A n++ layer 34 has a corresponding impurity concentration 34'. Voltage means 36 includes a center tapped voltage source 37 and output control 38. The first output terminal voltage means 36 is connected to ground and also connected to the n+ layer 31. A second output terminal of voltage means 36 is connected to n++ layer 34. Referring to FIG. 2b, an impurity concentration 33' within layer 33, is shown having an impurity concentration which changes from p+ at the layer 34–33 interface to p– as the layer 33-layer 32 interface is approached. The doping profile within space charge conducting layer 33 further enhances the semiconductor structure asymmetry as will be hereinafter apparent. FIGS. 2c–e show the $\bar{\rho}_{cf2}$ charge distribution, $\xi_{cf2}$ electric field distribution and $V_{cf2}$ appearing across the p+-layer 33. For purposes of comparison of the FIG. 1 and FIG. 2 structures $V_{cf2}$ has been adjusted to be equal to $V_{cf1}$ as represented by nine divisions on the voltage scale.

Referring to FIGS. 2f–h, the enhanced asymmetry of the structure becomes more readily apparent when the voltage means 36 is adjusted to provide a negative voltage at n++ layer 34 with respect to ground. At the point where the p+-region is fully depleted, the depletion region extends also into the n– layer 32 as is shown in FIG. 2f. The corresponding electric field is shown in $\xi_{br2}$ having a maximum amplitude of nine divisions equal to the area under the $\bar{\rho}_{br2}$ charge distribution. The area under the $\xi_{br2}$ of approximately 58.5 squares corresponds to the $V_{br2}$ voltage of 58.5 divisions on the voltage scale.

In summary, it is readily apparent that providing a layer 33 p+-doping profile further enhances the asymmetry of the semiconductor structure, and provides an improved majority charge carrier device suitable for use as a rectifier or for similar asymmetrical applications.

It follows from the above that a semiconductor structure having a symmetrical voltage-current relationship for current flow in either direction may easily be fabricated. Either the $n-$ regions 12 or 32 may be symmetrically disposed on each side of the $p$ layer 13 or 33. Or on the other hand, $n++$ layers such as 14 or 34 may be symmetrically disposed on either side of $p$ or $p+$-layers 13 and 33 respectively. The choice, of course, depends on the relative asymmetrical operational voltage desired. In such symmetrical operation the semiconductor structure could perform a circuit function analogous to voltage reference diode or a clipper, such as back-to-back Zener diodes. Similarly, although not as shown in FIGS. 1 or 2, it may be advantageous to provide a contact to the $p$ layer in either of the structures shown to provide a further control of charge-bias, and still maintain the fundamental operation as here described.

A first, discrete component embodiment of the invention is shown in FIG. 3a prior to the formation of metallization or other suitable contacts to the device.

To begin with, a silicon substrate 50, FIG. 3b, is selected having a support $n++$ layer 51 and a second $n$ type layer 52 formed thereon, wherein respective layers 51 and 52 have the desired thickness and impurity concentration as previously discussed in conjunction with the FIGS. 2a and b idealized model. Next as is shown in FIG. 3c, $p$ type impurities are diffused or otherwise formed in the top surface of layer 52 to form a $p$ layer 53 having the desired impurity concentration and doping profile as previously discussed in conjunction with FIG. 2b. Next a masking and passivation layer 54 formed of an oxide of the substrate, such as silicon dioxide, is formed by conventional methods on the upper surface of the $p+$-layer 53 as shown in FIG. 3c. Windows such as 56 are subsequently cut in the passivation layer 54 and $n$-type impurities are formed, such as by deposition and diffusion or by ion implantation and thermal anneal to form $n++$ region 58, FIG. 3e. Next, a window 59 is cut in the passivation layer formed during the formation of region 58. Of course it is understood that if the passivation layer is not required, and the diffusion is made directly in the $p+$-layer 53, then this step may be omitted. Finally, a metal contact 61 is formed on the $n++$ region 58. Metal contact 61 may be formed by a conventional masking step and a subsequent metal deposition.

An alternate embodiment of the discrete component semiconductor structure may be formed as shown in FIGS. 4a–f. The processing steps are similar to the steps described in the FIG. 3 embodiment except that the $p+$-layer is formed into the entire upper surface of the $n-$ layer. Briefly, FIG. 4a shows the completed structure prior to forming metallization or other contacts, wherein the substrate 70 of FIG. 4b includes an $n+$ support layer 71 a second $n$ type layer 72 doped $n-$, a $p+$-layer 73 is formed in the upper surface of layer 72 as shown in FIG. 4c, and finally as shown in FIG. 4d and $n++$ layer is formed in the upper surface of layer 73.

It is of course understood that in any of the processing steps shown in FIGS. 3, 4 and FIG. 5 hereinafter described, the formation of either $n$ or $p$ type layers in the silicon wafer, and particularly formation of the $p+$-layer may be through thermal deposition, diffusion or ion implantation or a combination of these techniques. It may prove advantageous to use a combination of the techniques to form the impurity profiles.

Still referring to FIG. 4, 4e shows the formation of a passivating layer 76 such as silicon dioxide formed on the upper surface of layer 74, and the subsequent steps of forming a window 77 in the passivating layer followed by the formation of the top metallization 78 contacting the $n++$ layer 74.

Referring to FIG. 4f plural semiconductor structures have been combined with metal bottom plates 79 and metal conducting and cooling plates or vanes 81 have been interposed between devices. The combination of plural devices series stacked and having interposed cooling vanes may be advantageous where high currents necessitate elevated junction temperatures, with series stacking being advantageous in high voltage applications.

Figure 5B:
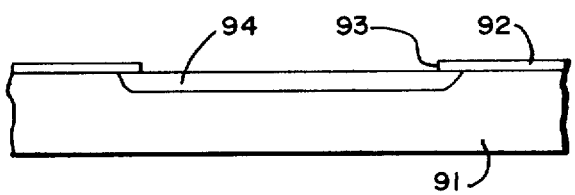
Figure 5C:
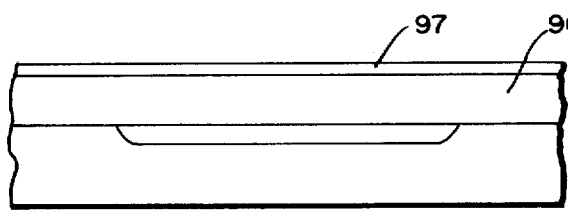
Figure 5D:
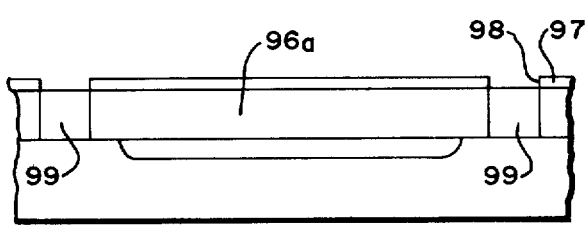
Figure 5E:
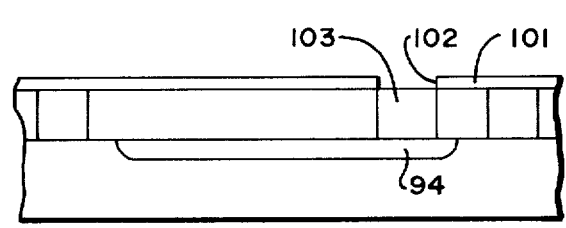
Figure 5F:
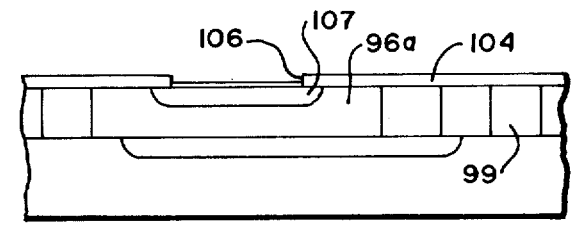

Referring to FIGS. 5a–h an alternate embodiment and fabrication compatible with integrated circuit processing technology is shown. Referring to FIG. 5b, a starting substrate having $p$ impurities formed therein is used, a typical range for integrated circuit substrate resistivity being from 6 to 25 ohm-cm. An oxidation and masking layer 92 is formed on the upper surface of substrate 91, windows 93 are opened to expose portions of the substrate 91 and a first $n$ region 94 doped $n+$ is formed in the exposed area of substrate 91. Again region 94 may be thermally deposited or ion implanted and diffused as shown in FIG. 5b. This step is compatible with the conventional step of forming a buried layer in conventional integrated circuit processing. Next, layer 92 is removed and $n-$ layer 96 is formed on the upper surface of the wafer. Layer 96 may be formed by epitaxial deposition. Next an insulating layer 97 such as silicon dioxide is formed on the upper surface of layer 96, FIG. 5c. Windows 98 are opened in the insulating layer and the layer is used as a mask to form a $p$ type isolation ring 99 extending from the upper surface of the wafer downward to contact the $p$ substrate 91 thereby isolating the $n$-epitaxial region 96a, FIG. 5d. This processing step is compatible with the conventional formation of isolation rings in integrated circuit processing.

Layer 97 is then removed and insulating and masking layer 101 is formed, and may be silicon dioxide. Next a window 102 is opened in layer 101 positioned above the buried $n+$ layer 94 so that in $n+$ impurities when introduced will contact the buried $n+$ region 94, FIG. 5e. Next an $n+$ region 103 is formed extending downward from the upper surface of the $n-$ layer to contact the buried $n+$ layer 94. This step is compatible with the collector plug formation step in conventional integrated circuit processing.

Figure 5G:
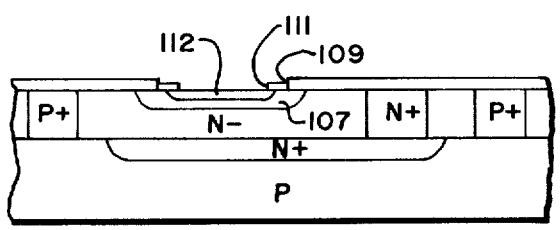
Figure 5H:
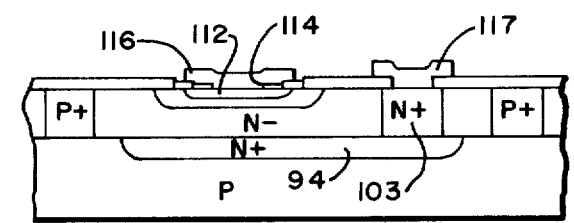

Next layer 101 is removed and a layer 104 formed on the surface of the wafer. Windows 106 are formed in insulating layer 104 and positioned within the $n-$ epitaxial region 96a enclosed by isolation ring 99. Next $p+$-regions are formed in the upper surface of the $n$-epitaxial region 96a using thermal or ion implanted deposition and diffusion, FIG. 5f. Next an additional insulating and masking layer 109 is formed on the exposed surface of $p+$-region 107 and a window 111 formed therein. Next an $n++$ region 112 is formed entirely within region 107 such as by a thermal deposition or ion implantation and diffusion. Ion implantation offers a distinct advantage by virtue of the precision and accuracy of the deposition cycle. Windows 111 may be used for contacting the $n++$ region 112. If the insulating or oxide layer 109 has regrown in window 111, then a new window 114 may be formed and a subsequent metallization step forms metal contacts 116, contacting the n++ region 112 and metal contact 117 contacting the n+ region 103 and thereby n+ region 94, FIG. 5h. The series of steps as shown in FIG. 5g and 5h are compatible with the formation of the emitter and subsequent metallization steps in NPN integrated circuit processing.

It is apparent that the above impurity and doping processing sequence is compatible with NPN transistor processing technology. NPN processing is preferred as it provides a choice of slow and fast diffusing impurities such as antimony, arsenic and phosphorus, to form n-type layers with various impurity concentrations and doping profiles required in the present invention. In the alternative however, the present invention could readily be formed using conventional PNP transistor processing technology and likewise the invention could be made compatible with PNP integrated circuit processing steps. In such processing the FIGS. 1–5 structures and steps would be applicable with n and p conductivity materials and regions reversed.

Thus it is readily apparent from the foregoing that there has been provided a majority charge carrier semiconductor structure which may be utilized as a variable threshold rectifier or as a voltage reference semiconductor structure depending on the choice of impurity concentrations and doping profiles of the regions included within the device. The symmetrical voltage-current relationships may be provided for current flow in either direction and may perform a circuit function analogous to voltage reference diode or a clipper, such as back-to-back Zener diodes. Alternatively a slightly asymmetrical or highly asymmetrical voltage-current relationship may be selected for a rectifier or other applications where a high front-to-back voltage-current relationship is desired.

I claim:

1. A rectifier and reference structure utilizing majority charge carriers comprising: a one-conductivity support layer and means for making electrical contact to said support layer, a second one-conductivity layer having a concentration differing from and carried by the support layer, an opposite-conductivity layer carried by the second layer to form a first junction, a third one-conductivity layer carried atop the opposite-conductivity layer to form a second junction and means for making electrical contact to said third layer, said opposite-conductivity layer having a decreasing impurity concentration from said second junction to said first junction wherein the second one-conductivity, opposite-conductivity, and third one-conductivity layer impurity concentrations and the opposite-conductivity layer thickness are selected to form a first depletion region at said first junction, so that when voltage means of one polarity is applied between said contacts said structure opposes current flow until a voltage magnitude is reached which causes said first depletion region to extend through the predetermined thickness of the opposite conductivity layer to intercouple said second and third one-conductivity layers, said impurity concentrations being further selected to provide said first depletion region intercoupling before avalanche and Zener breakdown of said first junction, and wherein said one-conductivity, opposite-conductivity and third one-conductivity layers have impurity concentrations further selected to form a second depletion region at said second junction, so that when voltage means of opposite polarity is applied between said contacts said structure opposes current flow until a voltage magnitude is reached which causes said second depletion region to extend through said predetermined thickness of the opposite-conductivity layer to intercouple said second and third one-conductivity layers, said impurity concentrations being further selected to provide said second depletion region intercoupling before avalanche and Zener breakdown of said second junction.

2. A structure as in claim 1 wherein said second one-conductivity, opposite conductivity and third one-conductivity layer impurity concentrations and said opposite-conductivity layer thickness are selected to provide a symmetrical current flow characteristic when voltage means is applied for equal voltage magnitudes of respective one and opposite polarities.

3. A semiconductor structure as in claim 1 wherein said second one-conductivity, opposite-conductivity, and third one-conductivity layer impurity concentrations and the opposite-conductivity region thickness are selected to provide an asymmetrical current flow characteristic when a first voltage magnitude of one polarity is applied and when a second voltage magnitude of opposite polarity is alternately applied.

4. A semiconductor structure as in claim 3 wherein said one-conductivity support layer has a thickness of approximately 1⅓ microns and an impurity concentration of approximately $2 \times 10^{19}$ impurity atoms/cm.$^3$, said second one-conductivity layer has a thickness of approximately 4 microns and an impurity concentration of $8 \times 10^{14}$ impurity atoms/cm.$^3$, said opposite-conductivity layer has a thickness of approximately 1 micron and an impurity concentration of $4 \times 10^{16}$ impurity atoms/cm.$^3$ and said third one-conductivity layer has a thickness of approximately 1 2/3 microns and an impurity concentration of $8 \times 10^{19}$ impurity atoms/cm.$^3$.

5. A semiconductor structure as in claim 1 wherein said opposite-conductivity decreases from approximately $2 \times 10^{17}$ impurity atoms/cm.$^3$ at said second junction to approximately $4 \times 10^{14}$ impurity atoms/cm.$^3$ at first junction.

6. A rectifier and reference structure utilizing majority charge carriers and having first and second PN junctions comprising: a p type substrate having a surface, an n+ region formed in the substrate extending to said surface, an n− epitaxial layer formed on the upper surface of said substrate, a p+ isolation ring extending downward from the upper surface of said epitaxial layer to contact said p type substrate, said isolation ring positioned beyond the outer periphery of said n+ region, to form an n− enclosed epitaxial region, an n+ region extending downward from the upper surface of said layer to contact said n+ buried region formed in said substrate, a p+-region formed in the enclosed epitaxial region extending to the surface forming a second junction therewith having a corresponding depletion region, an n++ region formed and extending to the surface to form a first junction therewith having a corresponding depletion region, said p+-region having a decreasing impurity concentration from said second junction to said first junction, ohmic contacts to the exposed n++ and n+ region upper surfaces so that when voltage means of either one or the opposite polarity is applied between said contacts said structure opposes current flow until the voltage magnitude causes the corresponding depletion region to extend through said p+-layer to intercouple said n− layer and n++ region.

* * * * *